United States Patent
Suzuki

(10) Patent No.: US 8,035,994 B2
(45) Date of Patent: Oct. 11, 2011

(54) HIGH FREQUENCY STORING CASE AND HIGH FREQUENCY MODULE

(75) Inventor: Takuya Suzuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/918,239

(22) PCT Filed: Feb. 26, 2009

(86) PCT No.: PCT/JP2009/053593
§ 371 (c)(1), (2), (4) Date: Aug. 18, 2010

(87) PCT Pub. No.: WO2009/139210
PCT Pub. Date: Nov. 19, 2009

(65) Prior Publication Data
US 2010/0315799 A1    Dec. 16, 2010

(30) Foreign Application Priority Data
May 12, 2008    (JP) .................................. 2008-124919

(51) Int. Cl.
*H05K 9/00* (2006.01)
(52) U.S. Cl. ........................................ 361/818; 361/761
(58) Field of Classification Search .................. 361/818; 333/247, 246; 342/175; 257/728
See application file for complete search history.

(56) References Cited

U.S. PATENT DOCUMENTS

| | | | |
|---|---|---|---|
| 6,239,669 B1 * | 5/2001 | Koriyama et al. | 333/26 |
| 6,335,669 B1 * | 1/2002 | Miyazaki et al. | 333/247 |
| 6,535,090 B1 * | 3/2003 | Matsuzuka et al. | 333/246 |
| 2002/0003298 A1 * | 1/2002 | Koriyama et al. | 257/728 |
| 2002/0074654 A1 * | 6/2002 | Koriyama | 257/728 |
| 2004/0155723 A1 * | 8/2004 | Koriyama | 333/26 |
| 2006/0097818 A1 * | 5/2006 | Camiade et al. | 333/26 |
| 2006/0202312 A1 | 9/2006 | Iijima et al. | |
| 2007/0001300 A1 * | 1/2007 | Kohjiro et al. | 257/728 |
| 2007/0040735 A1 * | 2/2007 | Matsuo et al. | 342/175 |
| 2007/0200204 A1 * | 8/2007 | Suzuki et al. | 333/247 |

FOREIGN PATENT DOCUMENTS

| | | |
|---|---|---|
| JP | 10 41421 | 2/1998 |
| JP | 2002 299503 | 10/2002 |
| JP | 2005 311337 | 11/2005 |
| JP | 2006 253953 | 9/2006 |

* cited by examiner

*Primary Examiner* — Tuan T Dinh
*Assistant Examiner* — Steven Sawyer
(74) *Attorney, Agent, or Firm* — Oblon, Spivak, McClelland, Maier & Neustadt, L.L.P.

(57) ABSTRACT

A cavity configured by electrically connecting an earth conductor formed on a multilayer dielectric substrate and on which a plurality of high frequency circuits are mounted, and a shield cover member. A waveguide aperture is formed on the earth conductor on which the high frequency circuits are mounted and is electrically coupled to the cavity, and an end-short-circuited dielectric waveguide formed in a direction of layer lamination of the multilayer dielectric substrate is connected to the waveguide aperture, and has a length approximately ¼ of an effective wavelength in the substrate of a signal wave. Spatial isolation between the high frequency circuits is ensured by an inexpensive and simple configuration using the single cavity.

6 Claims, 4 Drawing Sheets

HIGH FREQUENCY STORING CASE AND HIGH FREQUENCY MODULE

TECHNICAL FIELD

The present invention relates to a high frequency storing case and a high frequency module including a cavity, which is a space electromagnetically shielded by a multilayer dielectric substrate on which a plurality of high frequency circuits are mounted, and a shield cover member that covers the multilayer dielectric substrate.

BACKGROUND ART

In a high frequency package on which high frequency circuits operating at a high frequency band such as a microwave band or a millimeter band are to be mounted, the high frequency circuits are often mounted in a cavity electrically shielded by a metal frame or the like, in view of stability in the operation, EMI (radiated spurious) standard and the like.

In Patent Document 1, to avoid space interference between semiconductor chips of different functions, a package assembly is divided by a seal ring or individual cover member into a plurality of sections (cavities), the semiconductor chips are mounted on each of the divided sections with respect to each function, and the semiconductor chips on the sections are electrically connected by using a feedthrough.

Patent Document 1: Japanese Patent Application Laid-open No. H10-41421

DISCLOSURE OF INVENTION

Problem to be Solved by the Invention

However, this conventional package structure has many problems related to costs and reliability including increase in the number of members such as the seal ring and the cover, and complicated manufacturing steps such as soldering to the package and welding of the cover. In the high frequency band such as the millimeter band, the chip size is of the order of the wavelength (to about 1 millimeter). Accordingly, shielding or sectioning in a cavity physical dimension that provides substantial cutoff cannot be realized, which requires use of an expensive absorber such as a resistor or a magnetic body. Hence, a package structure or a module structure in a simple configuration that can ensure isolation also in the high frequency band such as the microwave band and the millimeter band has been desired.

The present invention has been achieved in view of the above circumstances, and an object of the present invention is to obtain a high frequency storing case and a high frequency module that can ensure spatial isolation between plural high frequency circuits with an inexpensive and simple configuration using a single cavity.

Means for Solving Problem

To solve above-mentioned problems and to achieve the object, a high frequency storing case stores therein a plurality of high frequency circuits to be mounted on a multilayer dielectric substrate, and includes a cavity that is formed at least by an electromagnetic shield that is obtained by electrically connecting an earth conductor that is formed on the multilayer dielectric substrate and on which the plural high frequency circuits arranged in a signal propagation direction are mounted, and a shield cover member that spatially covers the plural high frequency circuits, and that has a length in a direction perpendicular to an arrangement direction of the plural high frequency circuits, smaller than ½ of an effective wavelength in the substrate of a first signal wave generated by the high frequency circuit, a waveguide aperture that is formed on the earth conductor on which the high frequency circuits are mounted and that is electrically coupled to the cavity, and an end-short-circuited dielectric waveguide that is connected to the waveguide aperture, is formed in a direction of layer lamination of the multilayer dielectric substrate, and has a length approximately ¼ of an effective wavelength in the substrate of a second signal wave having a frequency N times (N≧2) higher than that of the first signal wave generated by the high frequency circuit.

Effect of the Invention

According to the present invention, the waveguide aperture and the end-short-circuited dielectric waveguide are included, and the waveguide aperture and the end-short-circuited dielectric waveguide are caused to operate as a reflection circuit for signals that propagate through the cavity. Therefore, spatial isolation between the plural high frequency circuits can be ensured by an inexpensive and simple configuration using the single cavity.

EXPLANATIONS OF LETTERS OR NUMERALS

Figure 1:
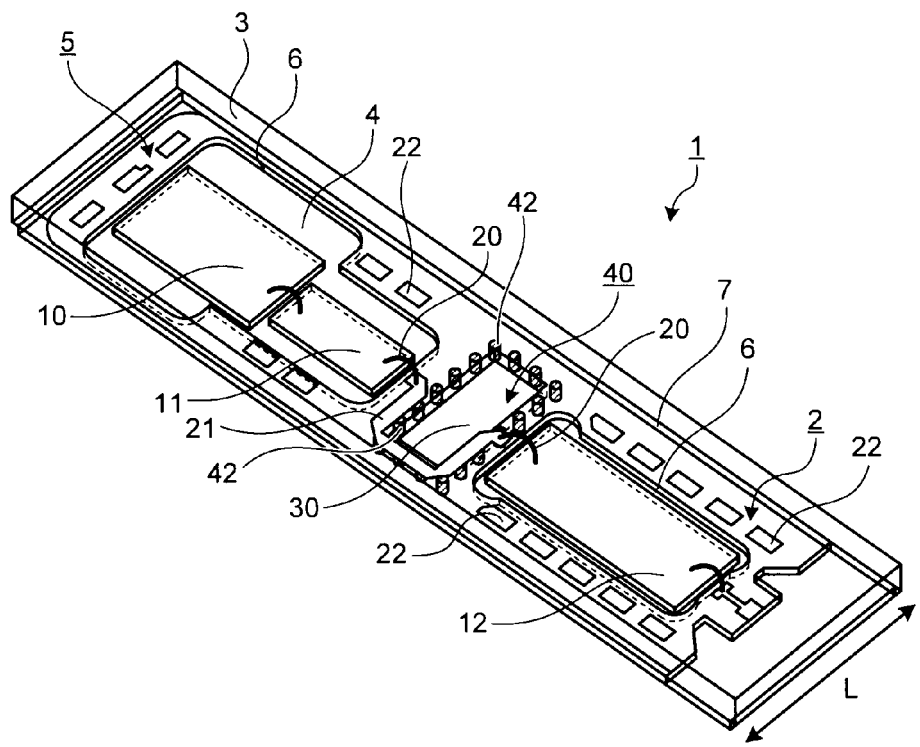
FIG. 1 is a perspective view of a high frequency module according to an embodiment of the present invention.

1 High frequency module
2 Multilayer dielectric substrate
3 Shield cover member
4 Earth conductor
5 Cavity
6 IC mounting recess
7 Surface-layer earth conductor
8 Through hole
10 Oscillating circuit
11 Amplifying circuit
12 Multiplying and amplifying circuit
20 Wire
21 Surface-layer signal line
22 Contact pad
30 Waveguide aperture
40 End-short-circuited dielectric waveguide
41 Inner-layer earth conductor
42 Through hole

BEST MODE(S) FOR CARRYING OUT THE INVENTION

Exemplary embodiments of a high frequency storing case (or a high frequency package) and a high frequency module according to the present invention will be explained below in detail with reference to the accompanying drawings. The present invention is not limited to the embodiments.

Figure 2:
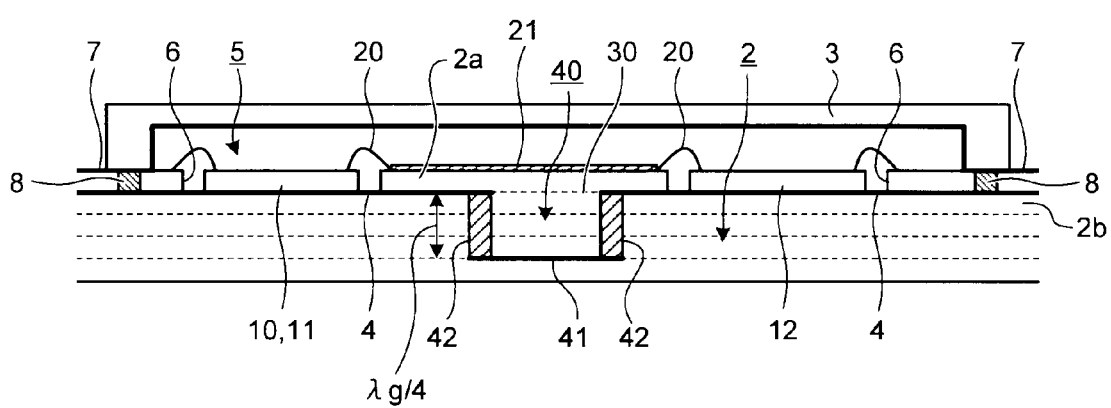
FIG. 2 is a cross-sectional view of the high frequency module according to the embodiment of the present invention.
Figure 3:
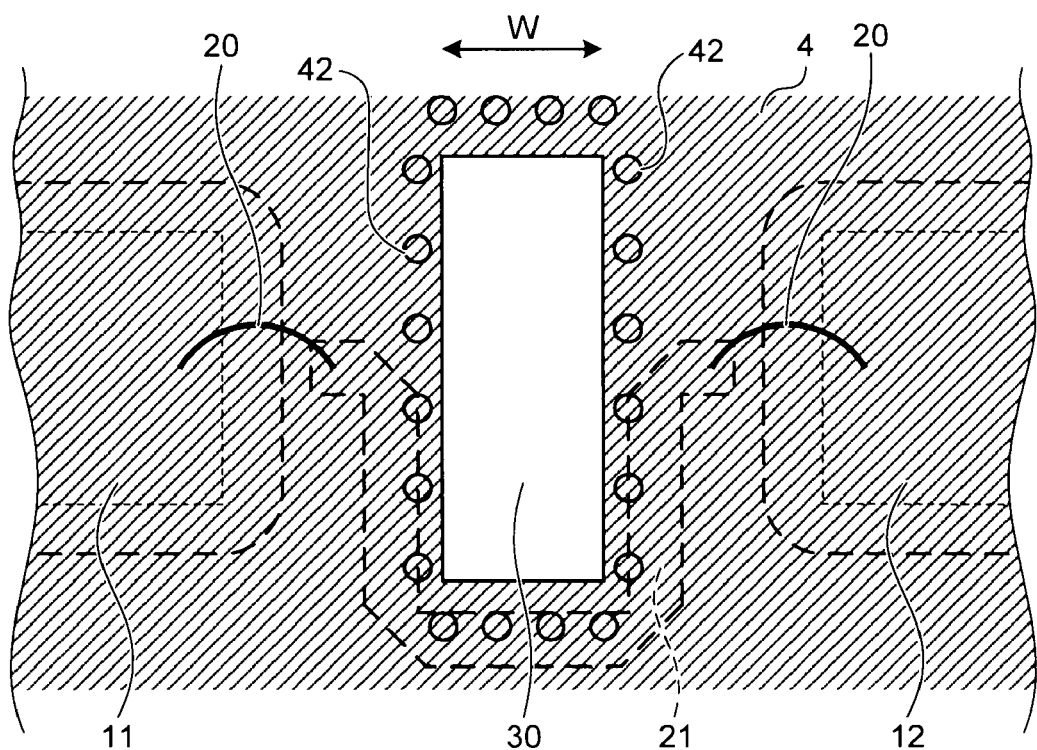
FIG. 3 is a plan view of the high frequency module according to the embodiment of the present invention.

FIGS. 1 to 3 depict a configuration of a high frequency module according to an embodiment of the present invention. On a high frequency module 1, a plurality of high frequency circuits that operate at a high frequency band such as the microwave band or the millimeter band are mounted. The high frequency module 1 is favorably applied to an FM-CW (frequency modulated continuous-wave) radar, for example. It can be also used for a communication device or a microwave radar.

In the present embodiment, an oscillating circuit 10 that generates a high frequency signal of a frequency f0, an amplifying circuit 11 that amplifies an output from the oscillating circuit 10, a multiplying and amplifying circuit 12 that multiplying an output from the amplifying circuit 11 by N (N≧2), amplifies a multiplied signal of a frequency N·f0, and outputs the amplified signal and the like are mounted as the high frequency circuits. The high frequency circuits include a semiconductor device such as a field effect transistor or a high electron mobility transistor, or an MIC (microwave integrated circuit) or an MMIC (monolithic microwave integrated circuit) including a semiconductor device and an external substrate such as a ceramic substrate.

These high frequency circuits are mounted within a cavity 5 which is an airtight and electromagnetically-shielded space formed by a shield cover member 3 (only an internal wall of the cover member is shown in the drawings), a multilayer dielectric substrate 2 or the like. The shield cover member 3 spatially covers the high frequency circuits, and can be made of metal or have a metal layer formed on the internal wall thereof. A plurality of recesses for mounting the high frequency circuits (hereinafter, "IC mounting recesses") 6 are formed on the multilayer dielectric substrate 2. The IC mounting recesses 6 are formed by forming bored portions in an upper layer (a first layer in the example shown in the drawings) 2a of the multilayer dielectric substrate 2. An earth conductor 4 is formed on surfaces of the bottoms of the IC mounting recesses 6. In the present embodiment, as shown in FIG. 2, the earth conductor 4 is a ground plane formed between the dielectric layer 2a as the upper layer of the multilayer dielectric substrate 2 and an underlying dielectric layer 2b. The high frequency circuits such as the oscillating circuit 10, the amplifying circuit 11, and the multiplying and amplifying circuit 12 are mounted on the earth conductor 4.

In the present embodiment, the high frequency circuits such as the oscillating circuit 10, the amplifying circuit 11, and the multiplying and amplifying circuit 12 are mounted on the earth conductor 4 formed on the bottoms of the IC mounting recesses 6. Therefore, a surface-layer earth conductor 7 is formed at least at a portion where the shield cover member 3 abuts the surface of the multilayer dielectric substrate 2 to electrically connect the shield cover member 3 and the earth conductor 4. The surface-layer earth conductor 7 and the earth conductor 4 are connected via a plurality of through holes 8. That is, in the present embodiment, the shield cover member 3, the surface-layer earth conductor 7, the plural through holes 8, and the earth conductor 4 form the cavity 5 also as a shielded space.

The high frequency circuits are wire-bonding connected with a wire 20 made of gold or the like. Another conductive connecting member such as a gold ribbon or a solder ball can be used instead of the wire. As shown in FIG. 3, the amplifying circuit 11 and the multiplying and amplifying circuit 12 are not connected by a feedthrough, and the wire 20 and a signal line 21 such as a microstrip line or a coplanar line formed on the surface-layer of dielectric layer 2a establish electrical input/output connection therebetween. Contact pads 22 are formed on the surface layer of the multilayer dielectric substrate 2 to supply DC bias voltage, or to input or output a control signal between the high frequency circuits. The contact pads 22 and the high frequency circuits are connected by wires, which are not shown in FIG. 1.

A waveguide aperture 30 as a space pattern for the earth conductor 4 on which the high frequency circuits are mounted is formed between the amplifying circuit 11 that operates at the frequency f0 and the multiplying and amplifying circuit 12 that operates at the frequency N·f0. At the end of the waveguide aperture 30, an end-short-circuited dielectric waveguide 40 extending in a direction of layer lamination of the multilayer dielectric substrate 2 and having a length approximately ¼ (or an odd-number-fold thereof) of an effective wavelength λg in the substrate of a signal wave is formed. The dielectric waveguide 40 includes an inner-layer earth conductor 41 formed at a depth position of approximately λg/4 (or an odd-number-fold thereof) from the waveguide aperture 30, through holes (ground vias) 42 connecting the earth conductor 4 on which the high frequency circuits are mounted and the inner-layer earth conductor 41, and a dielectric body arranged at a portion surrounded by the inner-layer earth conductor 41 and the plural through holes 42. The dielectric waveguide 40 functions as a dielectric waveguide having a short-circuited surface at an end thereof.

As described above, in the present embodiment, the plural high frequency circuits operating at the plural operation frequency bands, such as the oscillating circuit 10, the amplifying circuit 11, and the multiplying and amplifying circuit 12, are arranged within a high frequency storing case in which the single cavity 5 is formed by the multilayer dielectric substrate 2 and the shield cover member 3 in a direction of signal transmission (one-dimensionally in tandem) across the waveguide aperture 30 and the dielectric waveguide 40, thereby forming a high frequency module. The oscillating circuit 10 and the amplifying circuit 11 that operate at the pre-multiplication frequency f0, and the multiplying and amplifying circuit 12 that operates at the post-multiplication frequency N·f0 are separately arranged across the waveguide aperture 30 and the dielectric waveguide 40. Other high frequency circuits can be arranged (in a transverse direction) around the high frequency circuits arranged in tandem to arrange the high frequency circuits elongatedly and two-dimensionally.

In this way, when the high frequency circuits are arranged in the signal transmission direction within the cavity 5, signals adversely propagate through the space if a cavity length L is not sufficiently smaller than approximately ½ (cutoff dimension) of a wavelength corresponding to the operation frequency of the high frequency circuits, and this causes malfunction (unnecessary oscillation, frequency fluctuation) of the high frequency circuits due to feedback or coupling. Particularly when a frequency of a high frequency signal to be handled is higher, the cutoff dimension becomes closer to physical sizes of the high frequency circuits to be stored, and therefore spatial feedback or coupling occurs more easily. The cavity length L here is a length of the cavity 5 along a direction perpendicular to the arrangement direction of the high frequency circuits.

In the present embodiment, a dimension that is smaller than a dimension providing cutoff to the oscillating circuit 10, the amplifying circuit 11 and the like that operate at the pre-multiplication frequency f0, that is, a dimension that is smaller than approximately ½ of the effective wavelength λ in the substrate of the signal wave at the frequency f0 (for example, 70 to 80% of ½ of the wavelength λ) is selected as the cavity length L. This dimension selection causes a frequency to be equal to or smaller than 1/N of that in a case where a dimension providing cutoff to the multiplying and amplifying circuit 12 that operates at the post-multiplication frequency N·f0 is selected. Therefore, a physical cutoff dimension can be easily realized.

The selection of this cavity length L inhibits propagation of signals at the frequency f0 and in a frequency band lower than the frequency f0 within the cavity 5. Accordingly, spatial isolation of the oscillating circuit 10 and the amplifying circuit 11 before multiplication is ensured, and the malfunction due to the feedback or coupling of the signals at the frequency f0 and in the frequency band lower than the frequency f0 can be prevented.

The selection of this cavity length L inhibits propagation of signals at the frequency f0 and in a frequency band lower than the frequency f0 within the cavity 5. Accordingly, spatial isolation of the oscillator 10 and the amplifier 11 before multiplication is ensured, and the malfunction due to the feedback or coupling of the signals at the frequency f0 and in the frequency band lower than the frequency f0 can be prevented.

Next, as an aperture dimension of the waveguide aperture 30, a dimension that provides electrically coupling to the cavity 5 for a high frequency signal of the post-multiplication frequency N·f0 outputted from the multiplying and amplifying circuit 12 is selected. The length $\lambda g/4$ of the dielectric waveguide 40 is set so that the dielectric waveguide 40 functions as a reflection reactance circuit for the high frequency signal of the post-multiplication frequency N·f0 outputted from the multiplying and amplifying circuit 12. That is, $\lambda g$ is a wavelength corresponding to the high frequency signal of the frequency N·f0.

This dimension selection of the waveguide aperture 30 and the dielectric waveguide 40 enables the waveguide aperture 30 and the dielectric waveguide 40 to act as a reflection stub of a dielectric body for the signals that propagate through the cavity, and suppresses N-fold wave signals that are fed back through the space from the multiplying and amplifying circuit 12 within the cavity 5 and coupled to the oscillating circuit 10 and the amplifying circuit 11 before multiplication. Accordingly, the malfunction of the oscillator and the amplifier can be prevented.

As the dimension of the waveguide aperture 30 and a length of the end-short-circuited dielectric waveguide 40 (a dimension W shown in FIG. 3), values that do not cause high-order mode resonance of the N-fold wave signal within the dielectric waveguide 40 (for example, a value that is smaller than $\lambda/4$ of an effective wavelength in the waveguide of the N-fold wave signal) are preferably selected. The waveguide aperture 30 is preferably located at a position where resonance with the cavity wall does not occur in the target (multiplied) signal frequency band.

Figure 4:
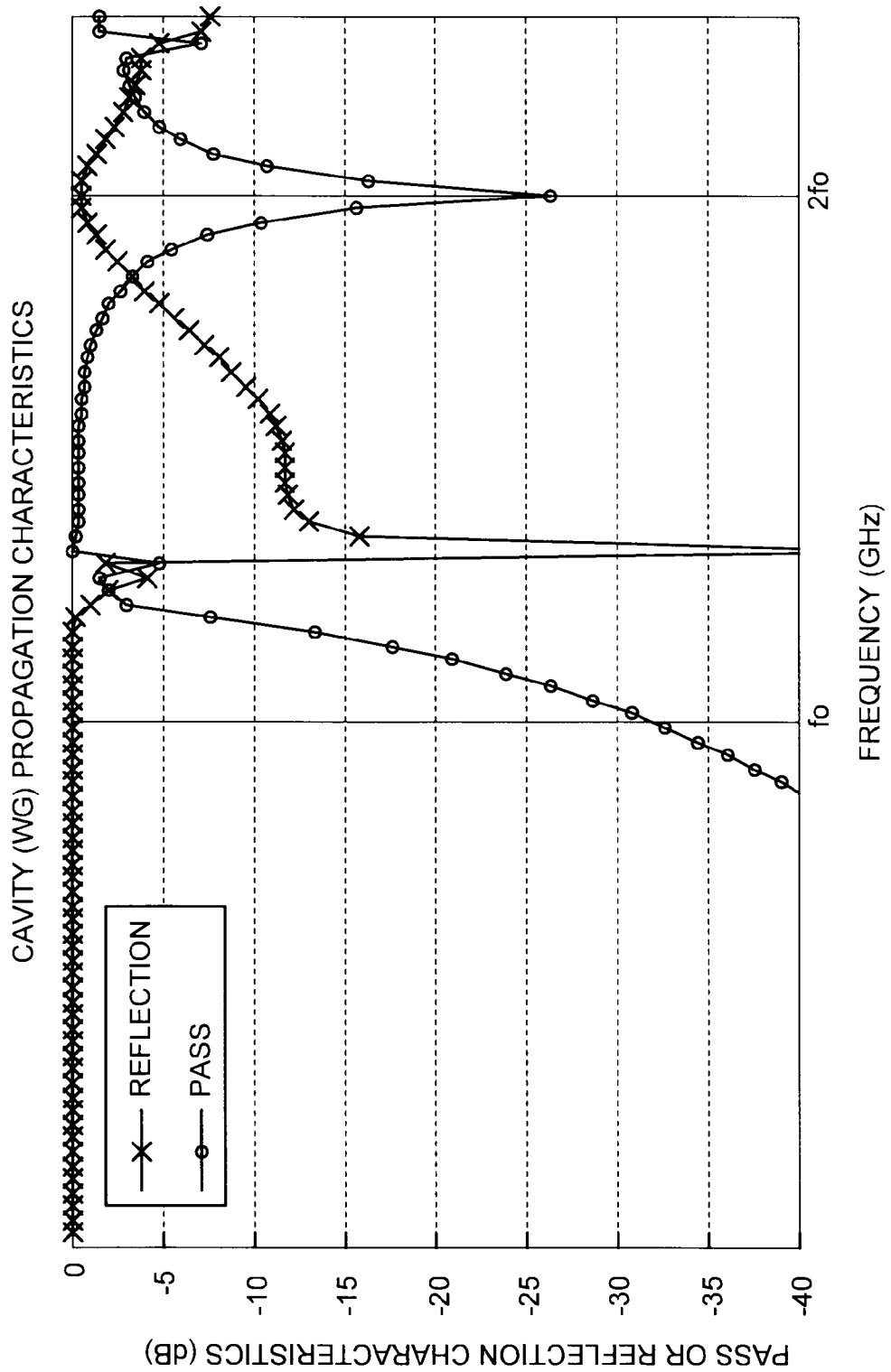
FIG. 4 depicts propagation characteristics within a cavity of the high frequency module according to the embodiment.

FIG. 4 depicts propagation characteristics within the cavity 5 of the high frequency module shown in FIGS. 1 to 3, where x indicates reflection characteristics and o indicates pass characteristics. Here, N=2. As shown in FIG. 4, because the cavity length L is set at a dimension that provides cutoff for the pre-multiplication frequency f0, the signals at the frequency f0 and in the frequency band lower than the frequency f0 cannot propagate through the cavity 5. Further, the waveguide aperture 30 and the dielectric waveguide 40 that act as the reflection reactance circuit for a high frequency signal of a post-multiplication frequency 2·f0 are provided. Therefore, the high frequency signal of the frequency 2·f0 is totally reflected, and the pass characteristics are attenuated by more than 25 dB.

Figure 5:
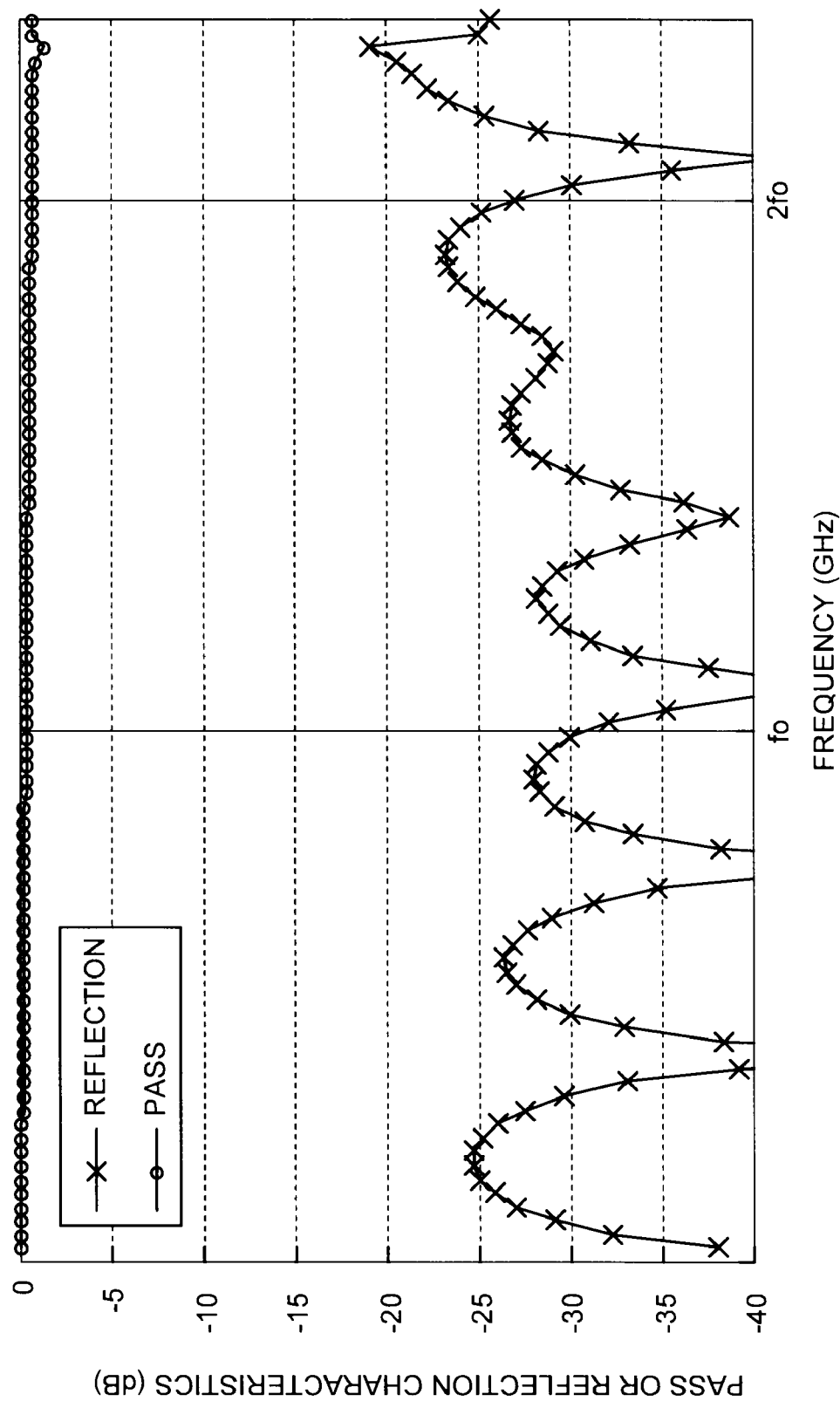
FIG. 5 depicts propagation characteristics of a surface-layer signal line of the high frequency module according to the embodiment.

FIG. 5 depicts propagation characteristics of the surface-layer signal line 21 in the high frequency module shown in FIGS. 1 to 3, where x indicates reflection characteristics and o indicates pass characteristics. The multiplying and amplifying circuit 12 receives the signal of the frequency f0 outputted from the amplifying circuit 11 through the surface-layer signal line 21, multiplies the received signal by N, and amplifies the multiplied signal. Therefore, the surface-layer signal line 21 needs to have satisfactory pass characteristics at least for the signal of the frequency f0. As shown in FIG. 5, satisfactory pass characteristics in each frequency band are obtained as the propagation characteristics of the surface-layer signal line 21.

As described above, the high frequency storing case according to the present embodiment includes the waveguide aperture 30 and the end-short-circuited dielectric waveguide 40, and the waveguide aperture 30 and the end-short-circuited dielectric waveguide 40 are caused to operate as a reflection circuit for the signals that propagates within the cavity. Therefore, spatial isolation between the high frequency circuits can be ensured by an inexpensive and simple configuration using a single cavity, without using the expensive seal ring or cover member and feedthrough.

According to the high frequency module of the present embodiment, when a reference chip and a multiplication chip are separately laid out across the reflection circuit including the waveguide aperture 30 and the end-short-circuited dielectric waveguide 40, isolation between the chips can be ensured. Therefore, spatial feedback of a transmission wave (a multiplied wave) to the reference chip can be suppressed. That is, stable operations of the oscillator and the like, not affected by spatial loads can be expected because a reference wave thereof is cut off and a multiplied wave thereof is blocked by the reflection circuit.

In the above embodiment, the oscillating circuit and the multiplying circuit are adopted as the high frequency circuits that are stored in the signal cavity 5. However, operation frequencies of the high frequency circuits are not limited to those of factors of a natural number, and first and second high frequency circuits having different operation frequency bands can be separately arranged across the reflection circuit including the waveguide aperture 30 and the end-short-circuited dielectric waveguide 40.

In the above embodiment, the present invention is applied to the high frequency module having the high frequency circuits that are housed within the IC mounting recesses 6 formed in the multilayer dielectric substrate 2. However, the present invention can be also applied to a high frequency module having the high frequency circuits that are mounted on a flat surface layer of the multilayer dielectric substrate 2 having no IC mounting recesses 6. In the high frequency module having the multilayer dielectric substrate 2 with the flat surface layer, the cavity 5 can be formed by an earth conductor that is formed on the surface layer of the multilayer dielectric substrate 2 and on which the high frequency circuits are mounted, and the shield cover member 3.

The high frequency storing case according to the present embodiment is effective in ensuring isolation between stages of a multistage amplifier chip in which there is a problem of spatial feedback due to tandem connection. That is, in such case, two or more amplifying circuits that operate in the same frequency band are separately arranged in the single cavity 5 across the reflection circuit including the waveguide aperture 30 and the end-short-circuited dielectric waveguide 40, respectively. This enables to easily ensure isolation between the respective amplifying circuits in which there is the problem of spatial feedback due to tandem connection, and prevention of oscillation can be expected.

INDUSTRIAL APPLICABILITY

As described above, the high frequency storing case and the high frequency module according to the present invention are useful in cases where plural high frequency circuits that operate in different frequency bands are mounted.

The invention claimed is:

1. A high frequency storing case that stores therein a plurality of high frequency circuits to be mounted on a multilayer dielectric substrate, the high frequency storing case comprising:

a cavity that is formed at least by an electromagnetic shield that is obtained by electrically connecting an earth conductor that is formed on the multilayer dielectric substrate and on which the plural high frequency circuits arranged in a signal propagation direction are mounted, and a shield cover member that spatially covers the plural high frequency circuits, and that has a length in a direction perpendicular to an arrangement direction of the plural high frequency circuits, smaller than ½ of an effective wavelength in the substrate of a first signal wave generated by one of the high frequency circuits;

a waveguide aperture that is formed on the earth conductor on which the high frequency circuits are mounted and that is electrically coupled to the cavity, the waveguide aperture being located within the cavity; and an end-short-circuited dielectric waveguide that is connected to the waveguide aperture, is formed in a direction of layer lamination of the multilayer dielectric substrate, and has a length approximately ¼ of an effective wavelength in the substrate of a second signal wave having a frequency N times (N=>2) higher than that of the first signal wave generated by the one of the high frequency circuits; wherein the end-short-circuited dielectric waveguide is configured by an inner-layer earth conductor, and plural through holes connected to the earth conductor and the inner-layer earth conductor.

2. The high frequency storing case according to claim 1, wherein the cavity is configured by electrically connecting the earth conductor, the shield cover member, a surface-layer earth conductor that is formed on a surface of the multilayer dielectric substrate where the shield cover member abuts, and a through hole that connects the surface-layer earth conductor and the earth conductor on which the plural high frequency circuits are mounted.

3. The high frequency storing case according to claim 1, wherein the waveguide aperture is positioned in a direction perpendicular to the arrangement direction of the plural high frequency circuits.

4. The high frequency storing case according to claim 1, wherein the plurality of high frequency circuits includes an oscillating circuit, an amplifying circuit, and a multiplying circuit, the multiplying circuit being separately arranged across the waveguide aperture from the oscillating circuit and the amplifying circuit.

5. A high frequency module comprising:

a high frequency storing case that stores therein a plurality of high frequency circuits to be mounted on a multilayer dielectric substrate, the high frequency storing case including:

a cavity that is formed at least by an electromagnetic shield that is obtained by electrically connecting an earth conductor that is formed on the multilayer dielectric substrate and on which the plural high frequency circuits arranged in a signal propagation direction are mounted, and a shield cover member that spatially covers the plural high frequency circuits, and that has a length in a direction perpendicular to an arrangement direction of the plural high frequency circuits, smaller than ½ of an effective wavelength in the substrate of a first signal wave generated by one of the high frequency circuits;

a waveguide aperture that is formed on the earth conductor on which the high frequency circuits are mounted and that is electrically coupled to the cavity, the waveguide aperture being located within the cavity; and an end-short-circuited dielectric waveguide that is connected to the waveguide aperture, is formed in a direction of layer lamination of the multilayer dielectric substrate, and has a length approximately ¼ of an effective wavelength in the substrate of a second signal wave having a frequency N times (N≧2) higher than that of the first signal wave generated by the one of the high frequency circuits; and an oscillating circuit serving as the one of the high frequency circuit that generates the first signal wave, and a multiplying circuit serving as another of the high frequency circuits that multiplies the first signal wave generated by the oscillating circuit by N to generate the second signal wave, wherein the oscillating circuit and the multiplying circuit are separately arranged across the waveguide aperture within the cavity.

6. A high frequency module comprising:

a high frequency storing case that stores therein a plurality of high frequency circuits to be mounted on a multilayer dielectric substrate, the high frequency storing case including a cavity that is formed at least by an electromagnetic shield that is obtained by electrically connecting an earth conductor that is formed on the multilayer dielectric substrate and on which the plural high frequency circuits arranged in a signal propagation direction are mounted, and a shield cover member that spatially covers the plural high frequency circuits, and that has a length in a direction perpendicular to an arrangement direction of the plural high frequency circuits, smaller than ½ of an effective wavelength in the substrate of a first signal wave generated by one of the high frequency circuits, a waveguide aperture that is formed on the earth conductor on which the high frequency circuits are mounted and that is electrically coupled to the cavity, and an end-short-circuited dielectric waveguide that is connected to the waveguide aperture, is formed in a direction of layer lamination of the multilayer dielectric substrate, and has a length approximately ¼ of an effective wavelength in the substrate of a second signal wave having a frequency N times (N≧2) higher than that of the first signal wave generated by the one of the high frequency circuits; and two or more amplifying circuits serving as the high frequency circuits that amplify a signal frequency band in which the waveguide aperture and the end-short-circuited dielectric waveguide function as a reflection circuit, wherein the amplifying circuits are separately arranged across the waveguide aperture within the cavity.

* * * * *